United States Patent [19]
Matsuo

[11] Patent Number: 4,703,339
[45] Date of Patent: Oct. 27, 1987

[54] PACKAGE HAVING A HEAT SINK SUITABLE FOR A CERAMIC SUBSTRATE

[75] Inventor: Youichi Matsuo, Tokyo, Japan
[73] Assignee: NEC Corporation, Tokyo, Japan
[21] Appl. No.: 875,058
[22] Filed: Jun. 17, 1986
[30] Foreign Application Priority Data Jul. 8, 1985 [JP] Japan .................................. 60-148216

[51] Int. Cl.[4] ........................ H01L 23/36; C22C 21/02
[52] U.S. Cl. .......................................... 357/81; 357/80;
174/16 HS; 420/528; 420/548; 165/905
[58] Field of Search ..................... 357/80, 81; 420/548;
165/905; 420/528; 174/16 HS

[56] References Cited

U.S. PATENT DOCUMENTS

| 3,117,175 | 1/1964 | Kohlmeyer | 420/548 |
| 3,480,411 | 11/1969 | Pryor | 420/548 |
| 3,536,123 | 10/1970 | Izumi | 420/548 |
| 3,980,537 | 9/1976 | McMinn et al. | 420/548 |
| 4,113,473 | 9/1978 | Gauvry et al. | 420/548 |
| 4,611,238 | 9/1986 | Lewis et al. | 357/81 |

FOREIGN PATENT DOCUMENTS

| 0065686 | 12/1982 | European Pat. Off. | 357/81 |
| 0170963 | 2/1986 | European Pat. Off. | 420/548 |
| 2828044 | 11/1979 | Fed. Rep. of Germany | 357/81 |
| 59-35649 | 2/1984 | Japan | 420/548 |
| 59-91742 | 6/1984 | Japan | 357/81 |
| 0582732 | 11/1946 | United Kingdom | 420/548 |

Primary Examiner—Andrew J. James
Assistant Examiner—Jerome Jackson, Jr.
Attorney, Agent, or Firm—Burns, Doane, Swecker & Mathis

[57] ABSTRACT

A package including a heat sink especially suitable for a ceramic substrate is disclosed. The heat sink is formed of aluminum-silicon alloy material and is fixed to a surface of the ceramic substrate opposing a second surface on which at least one heat generating component is mounted.

6 Claims, 2 Drawing Figures

PACKAGE HAVING A HEAT SINK SUITABLE FOR A CERAMIC SUBSTRATE

BACKGROUND OF THE INVENTION

This invention relates to a package including a heat sink suitable for a ceramic substrate.

An example of conventional packages is disclosed in U.S. Pat. No. 4,398.208. Referring to FIG. 2 of the patent, the conventional package comprises an alumina-ceramic substrate 21, a plurality of integrated circuit (IC) chips 24 mounted on the upper surface of the substrate 21, a plurality of covers 22 covering the IC chips 24 and heat sinks 40 fixed to the lower surface of the substrate 21. Each of the heat sinks 40 used for the package is made of aluminum or copper. However, the heat expansion coefficients of aluminum and copper are about $24 \times 10^{-6}$ (1/°C. (centigrade)) and about $17 \times 10^{-6}$ (1/°C.), respectively, both of which are considerably greater than the heat expansion coefficient of ceramic (about $7 \times 10^{-6}$ (1/°C.)). For this reason, the conventional package has disadvantages that the heat sinks may come off the substrate and that cracks may develop in the substrate.

Another example of the conventional type packages is disclosed in the Japanese Utility Model Application Disclosure No. 91742/1984. A heat sink 5 used in the package is made of a copper-tungsten alloy or a copper-molybdenum alloy. Since the heat expansion coefficients of both alloys are approximately equal to that of the ceramic, the package is not affected by the above-mentioned coefficient difference. However, the package has a different disadvantage in that the weight of the entire package becomes considerably greater because the specific gravity of the copper-tungsten alloy and the copper-molybdenum alloy are no less than 16 and 9 (g(gram)/cm$^3$(cubic centimeter)), respectively. In addition, both the tungsten material and the molybdenum material are extremely expensive, resulting in a costly package.

SUMMARY OF THE INVENTION

An object of the invention is, therefore, to provide a light weight package free of large expansion coefficient differential to eliminate the above-mentioned disadvantages in the conventional packages.

A package including: substrate made of a ceramic material is provided. At least one heat generating component is fixed on a first surface of the substrate, and at least one heat sink is fixed on a second surface of the substrate opposite the first surface. This heat sink is made of aluminum-silicon alloy material.

The above and other features and advantages of the present invention will become more apparent from the following written description in conjunction with the accompanying drawings.

DESCRIPTION OF THE PREFERRED EMBODIMENT

Figure 1:
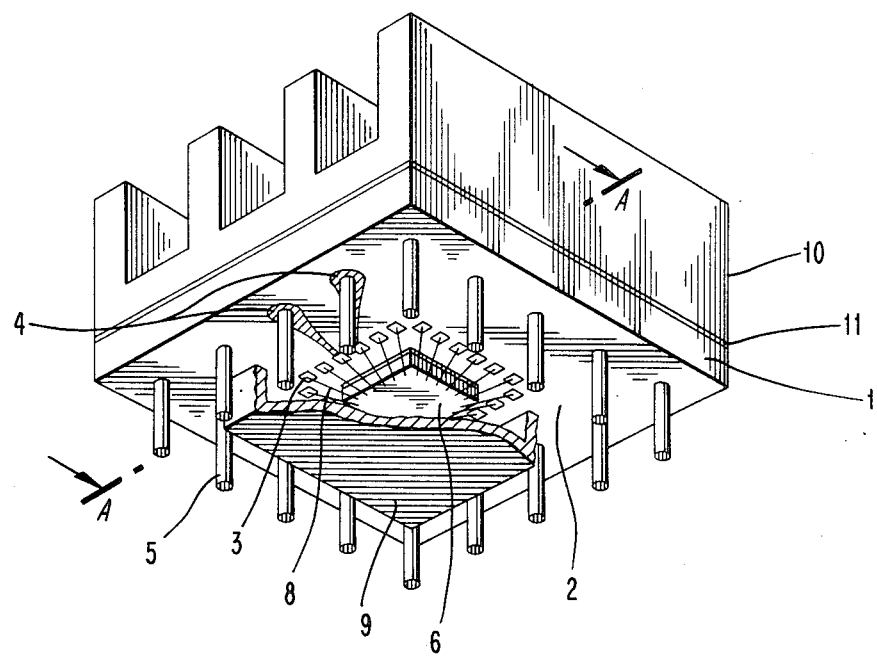
FIG. 1 is a perspective view of a package in accordance to an embodiment of the invention.

Referring now to the drawings wherein like numerals indicate like parts, the subject invention will be described in detail.

Figure 2:
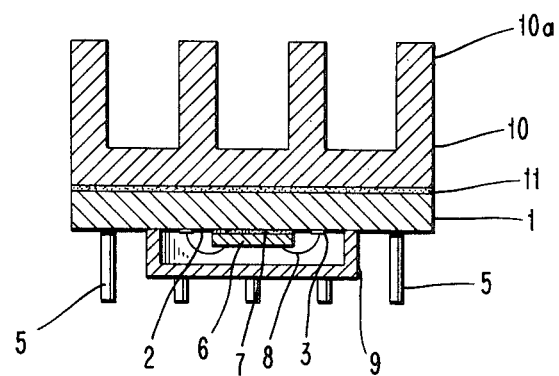
FIG. 2 is a cross-sectional view taken along a line A—A of FIG. 1.

In FIGS. 1 and 2, an embodiment of the invention comprises a heat sink 10, an alumina-ceramic substrate 1 as disclosed in the above-mentioned U.S. Pat. No. 4,398,208, and an adhesive 11 for fixing the heat sink 10 on a first surface of the substrate 1. On a second surface of the substrate 1 opposite the first surface, there are provided a semiconductor component 6, a plurality of connection pads 3 positioned close to the component 6, printed conductive patterns 4 connected to pads 3, a plurality of input/output terminal pins 5 connected to the patterns 4, bonding wires 8 for connecting bonding pads (not shown) formed on the component 6 to the pads 3, and a cap 9 protecting the component 6 from external mechanical force and covering the periphery of the component 6 so as to isolate it from external air. The component 6 is fixed on the second surface of the substrate 1 by an adhesive 7. Similarly, the cap 9 is fixed on the second surface of the substrate 1.

A high heat-conductive resin type adhesive, for instance, made by mixing high heat-conductive powder such as silver powder to an epoxy resin, can be used as an adhesive material which fixes the heat sink 10, having comb-like heat radiation fins 10a, onto the substrate 1 as well as to fix the component 6 onto the substrate 1. In this embodiment, after coating the entire first surface of the substrate 1 with the adhesive 11, the heat sink 10 is placed on the adhesive 11 and the substrate 1 is then kept in an atmosphere above about 100° C. for 30 minutes to harden the adhesive 11. As a result, the heat sink 10 and the substrate 1 are fixed. It is to be noted that the component 6 may be fited to the substrate 1 either before or after the heat sink 10 is fixed to the substrate 1.

The heat sink 10 is composed of an aluminum-silicon alloy material the heat expansion coefficient of which is somewhat greater than that of the alumina-ceramic material forming the substrate 1. The heat expansion coefficient of the aluminum-silicon alloy material is (10 to 15)$\times 10^{-6}$ (1/°C.) where the alloy contains silicon having a weight percentage ranging from 40 to 30, and is somewhat greater than that of the alumina-ceramic material ($7 \times 10^{-6}$ (1/°C.)). As a result, a thermal stress corresponding to a slight difference in the heat expansion coefficients occurs to such an extent that any practical problem is not appreciated. The specific gravity of the aluminum-silicon alloy material is 2.5 to 3 (g/cm$^3$) and is 1/5 and ⅓ of that of the conventional copper-tungsten alloy material and copper-molybdenum alloy material, respectively. Since the heat sink used in this embodiment is extremely light, the weight of the entire package can be reduced. Furthermore, since the aluminum-silicon alloy material contains inexpensive aluminum as its main component, the package can be produced at less expensive cost.

In the package having the above-mentioned structure, the heat generated in the component 6 is transferred to the heat sink 10 through the adhesive 7 and then through the substrate 1 and is radiated from the surface of the radiation fins 10a of the heat sink 10. Consequently, the temperature rise of the component 6 can be suppressed. In this case, the temperatures of the substrate 1 and the heat sink 10 naturally rise. However, since the difference of the heat expansion coefficients of the heat sink 10 and the substrate 1 is slight, the heat sink 10 does not come off the substrate 1 and cracks do not develop in the substrate 1. As result, reliability of the package can be improved.

Although the heat sink 10 is bonded to the substrate 1 by the resin type adhesive in the embodiment described above, the present invention is not particularly limited to this connection means. For example, the heat sink 10 may be brazed to the substrate 1 by use of a brazing material. In such a case, tin or solder is in advance formed on the first surface of the substrate 1 by a well-known thick-film-printing method, a well-known sputtering method, or a well-known plating method. Brazing is then made by use of solder or the like.

Although the alumina-ceramic is used as the substrate material in this embodiment, other ceramic materials such as glass ceramic may be used.

Furthermore, although only one component 6 and one heat sink 10 are mounted on this substrate 1 in the embodiment, a plurality of electronic components and a plurality of heat sinks may be mounted.

While this invention has been described in conjunction with the preferred embodiment thereof, it will be readily possible for those skilled in the art to put this invention into practice in various other manners.

What is claimed is:

1. A package comprising:
   a substrate made of a ceramic material;
   at least one heat generating component mounted on a first surface of said substrate; and
   at least one heat sink fixed on a second surface of said substrate opposite said first surface, and made of an aluminum-silicon alloy material, said aluminum-silicon alloy material containing silicon in a weight percentage ranging from 30% through 40%.

2. A package as claimed in claim 1, wherein said substrate and said heat sink are fixed by an adhesive.

3. A package as claimed in claim 1, wherein said substrate and said heat sink are fixed by brazing.

4. A package comprising:
   a substrate having a first and a second surface on opposing sides thereof, said substrate being made of ceramic material;
   at least one heat generating component mounted on said first surface of the substrate;
   at least one heat sink fixed to said second surface of the substrate;
   said at least one heat sink being made of aluminum-silicon alloy material containing silicon in a weight percentage ranging from 30% to 40%.

5. A package as recited in claim 4, wherein said at least one heat sink is fixed to said substrate by an adhesive.

6. A package as recited in claim 4, wherein said heat sink is fixed to said substrate by brazing.

* * * * *

Notice of Adverse Decisions in Interference

In Interference No. 102,250, involving Patent No. 4,703,339, Y. Matsuo, PACKAGE HAVING A HEAT SINK SUITABLE FOR A CERAMIC SUBSTRATE, final judgment adverse to the patentee was rendered October 27, 1989, as to claims 1-6.

*(Official Gazette February 20, 1990)*